United States Patent
Ishihara et al.

(10) Patent No.: US 9,530,766 B2
(45) Date of Patent: Dec. 27, 2016

(54) SEMICONDUCTOR DEVICE

(71) Applicant: Mitsubishi Electric Corporation, Tokyo (JP)

(72) Inventors: Mikio Ishihara, Tokyo (JP); Kazuaki Hiyama, Tokyo (JP); Tatsuya Kawase, Tokyo (JP); Tsuyoshi Osaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/897,362

(22) PCT Filed: Aug. 23, 2013

(86) PCT No.: PCT/JP2013/072558
§ 371 (c)(1),
(2) Date: Dec. 10, 2015

(87) PCT Pub. No.: WO2015/025422
PCT Pub. Date: Feb. 26, 2015

(65) Prior Publication Data
US 2016/0141284 A1    May 19, 2016

(51) Int. Cl.
*H01L 29/74* (2006.01)
*H01L 27/02* (2006.01)
*H03K 17/082* (2006.01)
*H01L 23/00* (2006.01)
*H01L 23/34* (2006.01)
*H01L 27/06* (2006.01)
*H03K 17/08* (2006.01)

(52) U.S. Cl.
CPC .......... *H01L 27/0251* (2013.01); *H01L 23/34* (2013.01); *H01L 24/06* (2013.01); *H01L 24/48* (2013.01);
(Continued)

(58) Field of Classification Search
CPC .. H01L 27/0251; H01L 27/0629; H01L 23/34; H01L 24/06; H01L 24/48; H01L 24/49; H03K 17/0828; H03K 2017/0806
(Continued)

(56) References Cited

U.S. PATENT DOCUMENTS

| 5,642,252 A | * | 6/1997 | Sakamoto | H01L 27/0248 |
| | | | | 257/E29.257 |
| 2004/0051145 A1 | * | 3/2004 | Nobe | H01L 27/0251 |
| | | | | 257/355 |
| 2005/0156267 A1 | * | 7/2005 | Mori | H01L 23/34 |
| | | | | 257/467 |

FOREIGN PATENT DOCUMENTS

| JP | H11-142254 A | 5/1999 |
| JP | 2000-058820 A | 2/2000 |

(Continued)

OTHER PUBLICATIONS

International Search Report—PCT/JP2013/072558 dated Sep. 17, 2013.
(Continued)

*Primary Examiner* — Tu-Tu Ho
(74) *Attorney, Agent, or Firm* — Studebaker & Brackett PC

(57) ABSTRACT

A transistor (2) is provided on a semiconductor substrate (8). A temperature detection diode (4) for monitoring temperature of an upper surface of the semiconductor substrate (8) is provided on the semiconductor substrate (8). An external electrode (7) is connected in common to an emitter (E) of the transistor (2) and a cathode (K) of the temperature detection diode (4). Therefore, an external electrode for the cathode (K) of the temperature detection diode (4) can be removed, and thus the device can be reduced in size and improved in terms of ease of assembly.

3 Claims, 4 Drawing Sheets

(52) U.S. Cl.
CPC ........... *H01L 24/49* (2013.01); *H01L 27/0629* (2013.01); *H03K 17/0828* (2013.01); *H01L 24/45* (2013.01); *H01L 2224/45124* (2013.01); *H01L 2224/45147* (2013.01); *H01L 2224/4813* (2013.01); *H01L 2224/4846* (2013.01); *H01L 2224/48091* (2013.01); *H01L 2224/48132* (2013.01); *H01L 2224/49175* (2013.01); *H01L 2924/13055* (2013.01); *H01L 2924/13091* (2013.01); *H03K 2017/0806* (2013.01)

(58) Field of Classification Search
USPC ........................................................ 257/140
See application file for complete search history.

(56) References Cited

FOREIGN PATENT DOCUMENTS

| | | |
|---|---|---|
| JP | 2002-190531 A | 7/2002 |
| JP | 2003-142689 A | 5/2003 |
| JP | 2005-166987 A | 6/2005 |
| JP | 2006-049567 A | 2/2006 |
| JP | 2009-159662 A | 7/2009 |
| JP | 2009-206140 A | 9/2009 |
| WO | 2015029159 A1 | 3/2015 |

OTHER PUBLICATIONS

Notification of Transmittal of Translation of the International Preliminary Report on Patentability and Translation of Written Opinion of the International Searching Authority; PCT/JP2013/072558 issued on Mar. 3, 2016.

An Office Action issued by the Japanese Patent Office on Aug. 30, 2016, which corresponds to Japanese Patent Application No. 2015-532669 and is related to U.S. Appl. No. 14/897,362; with partial English language translation.

\* cited by examiner

SEMICONDUCTOR DEVICE

TECHNICAL FIELD

The present invention relates to a semiconductor device including an on-chip temperature detection diode, and in particular to a semiconductor device reduced in size and improved in terms of ease of assembly.

BACKGROUND ART

A semiconductor device having a semiconductor chip such as an IGBT or MOSFET is used to perform switching for selecting between energization and shutoff at a high speed. During continuous switching operation, the chip produces heat due to power loss as a result of integration of the current flowing through the chip and the voltage applied to the chip. There is a possibility of the chip being broken when the temperature of the chip exceeds an operation guarantee range.

A semiconductor device incorporating an on-chip temperature detection diode to prevent the temperature of the chip from exceeding the operation guarantee range is therefore used (see, for example, Patent Literature 1). Since the VF of the diode lowers in direct proportion to the temperature, the temperature of the chip can be detected by monitoring the value of the VF. For example, a module may be protected from overheat on the basis of the chip temperature detected in the above-described way or the chip temperature may be fed back to an operating condition for a vehicle cooling system, thus enabling optimization of power loss.

CITATION LIST

Patent Literature

Patent Literature 1: Japanese Patent Laid-Open No. 2009-159662

SUMMARY OF INVENTION

Technical Problem

With a control circuit, drive and overheat protection or the like of, for example, the gate or the base of the semiconductor device are performed. The cathode of the temperature detection diode is connected to a reference potential (ground) of this control circuit. In ordinary cases, the emitter of the IGBT or the source of the MOSFET is also connected to the reference potential. In the conventional semiconductor device, however, the cathode of the temperature detection diode and the emitter of the IGBT are isolated from each other in the device. There is, therefore, a need to individually connect an external electrode to each of the cathode and the emitter. This has been a hindrance to reducing the product size. Also, there is another problem that an increased number of the external electrodes makes it difficult to assemble the device on a control substrate on which the control circuit is provided, and the assembly cost is increased.

The present invention has been achieved to solve the above-described problems, and an object of the present invention is to obtain a semiconductor device reduced in size and improved in terms of ease of assembly.

Means for Solving the Problems

A semiconductor device according to the present invention includes: a semiconductor substrate; a transistor on the semiconductor substrate; a temperature detection diode on the semiconductor substrate and monitoring temperature of an upper surface of the semiconductor substrate; and an external electrode connected in common to an emitter or a source of the transistor and a cathode of the temperature detection diode.

Advantageous Effects of Invention

The present invention makes it possible to reduce the size of the device and improve in terms of ease of assembly.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
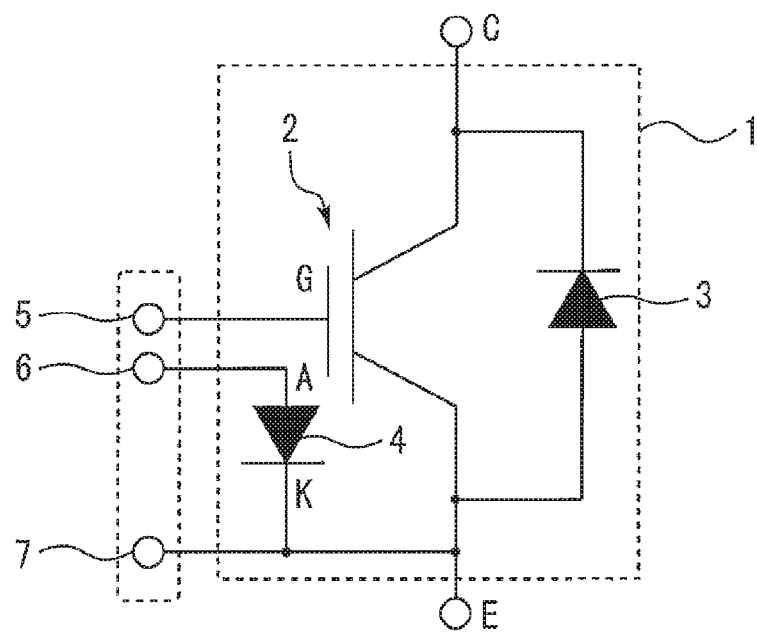
FIG. 1 is a circuit diagram showing a semiconductor device according to Embodiment 1 of the present invention.

FIG. 1 is a circuit diagram showing a semiconductor device according to Embodiment 1 of the present invention. A transistor 2, a freewheeling diode 3 and a temperature detection diode 4 are provided in a package 1. The transistor 2 is an IGBT but is not limited to this. It may alternatively be a MOSFET. An external electrode 5 is connected to a gate G of the transistor 2, and an external electrode 6 is connected to an anode A of the temperature detection diode 4. An external electrode 7 is connected in common to an emitter E (or a source of a MOSFET) and a cathode K of the temperature detection diode 4.

Figure 2:
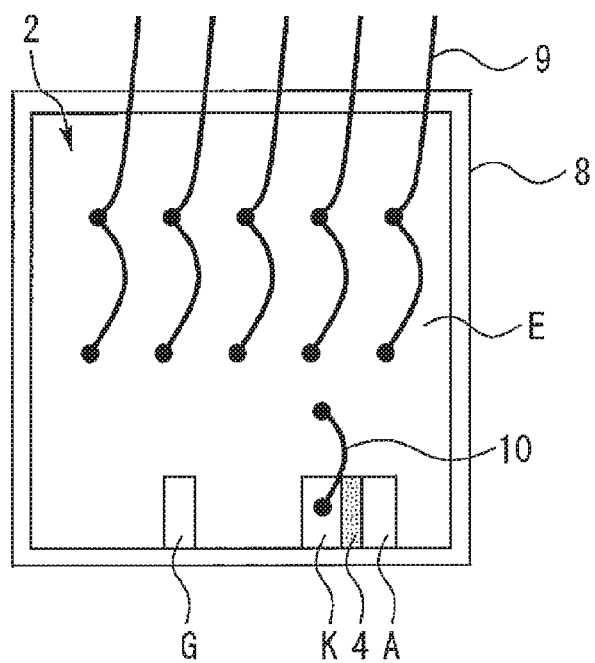
FIG. 2 is a top view of the semiconductor device according to Embodiment 1 of the present invention.

FIG. 2 is a top view of the semiconductor device according to Embodiment 1 of the present invention. The transistor 2 is provided on a semiconductor substrate 8. The temperature detection diode 4 for monitoring the temperature of an upper surface of the semiconductor substrate 8 is provided on the semiconductor substrate 8. A plurality of wires 9 of, for example, Al or Cu are connected to the emitter E of the transistor 2. A wire 10 connects the emitter E of the transistor 2 and the cathode K of the temperature detection diode 4 on the semiconductor substrate 8.

Figure 3:
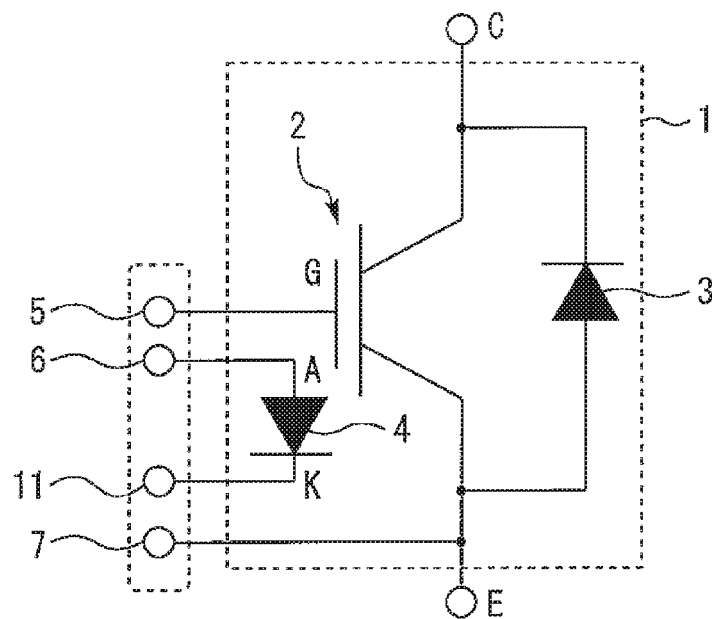
FIG. 3 is a circuit diagram showing a semiconductor device according to the comparative example.

The advantages of the present invention will subsequently be described in comparison with a comparative example. FIG. 3 is a circuit diagram showing a semiconductor device according to the comparative example. In the comparative example, the emitter E of the transistor 2 and the cathode K of the temperature detection diode 4 are isolated from each other in the device and there is, therefore, a need to individually connect each of the external electrodes 7 and 11 to one of the cathode and the emitter.

In contrast, in the present embodiment, the external electrode 11 for the cathode K of the temperature detection diode 4 can be removed since the emitter E and the cathode K of the temperature detection diode 4 are connected to each other in the device. The device can thus be reduced in size and improved in terms of ease of assembly. Also, the connection between the emitter E and the cathode K is enabled by only adding the wire 10 to the existing structure.

Embodiment 2

Figure 4:
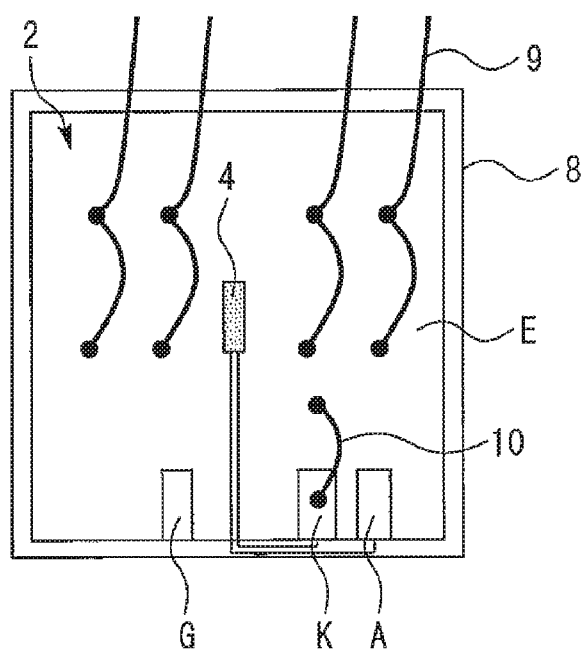
FIG. 4 is a top view of a semiconductor device according to Embodiment 2 of the present invention.

FIG. 4 is a top view of a semiconductor device according to Embodiment 2 of the present invention. In the present embodiment, the temperature detection diode 4 is disposed at a chip center, while the temperature detection diode 4 is disposed between the anode A and the cathode K in Embodiment 1. The same advantages as those of Embodiment 1 can also be obtained when the temperature detection diode 4 is disposed at a position other than the position between the anode A and the cathode K, as in the above-described case.

Embodiment 3

Figure 5:
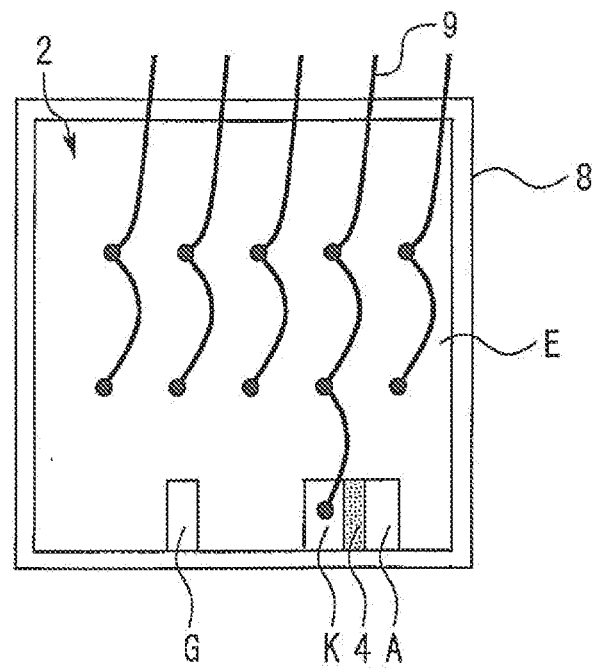
FIG. 5 is a top view of a semiconductor device according to Embodiment 3 of the present invention.

FIG. 5 is a top view of a semiconductor device according to Embodiment 3 of the present invention. One of the plurality of wires 9 is stitched and connected to the cathode K of the temperature detection diode 4 on the chip. Thus, the emitter E of the transistor 2 and the cathode K of the temperature detection diode 4 are thereby connected to each other in the device, One external electrode 7 can therefore be shared therebetween. Also, the assembly efficiency can be improved in comparison with Embodiments 1 and 2.

Embodiment 4

Figure 6:
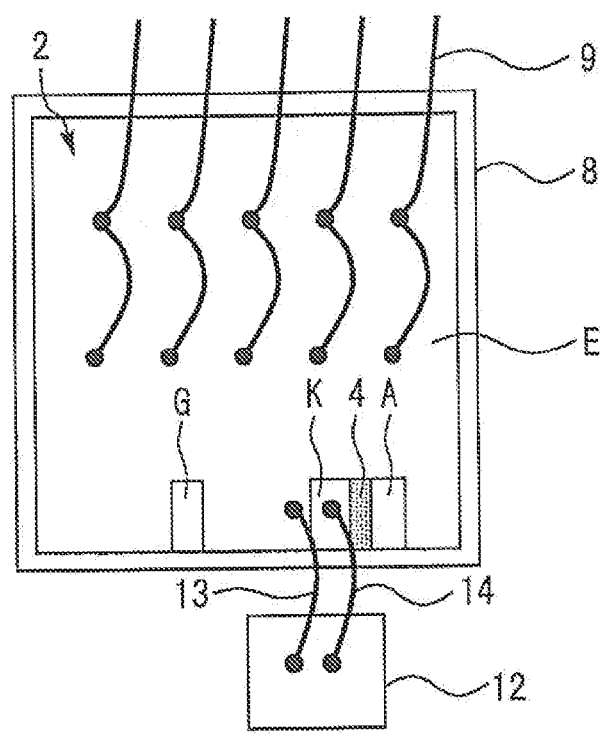
FIG. 6 is a top view of a semiconductor device according to Embodiment 4 of the present invention.

FIG. 6 is a top view of a semiconductor device according to Embodiment 4 of the present invention. A relay pad 12 is disposed outside the semiconductor substrate 8. A wire 13 of, for example, Al or Cu connects the relay pad 12 and the emitter E of the transistor 2 or the source. A wire 14 of, for example, Al or Cu connects the relay pad 12 and the cathode K of the temperature detection diode 4. The emitter E of the transistor 2 and the cathode K of the temperature detection diode 4 are thereby connected to each other in the device. One external electrode 7 can therefore be shared therebetween. Also, there is no need to change the wire bonding points on the chip from the existing structure. Therefore, the emitter wiring in the main circuit is not influenced.

Embodiment 5

Figure 7:
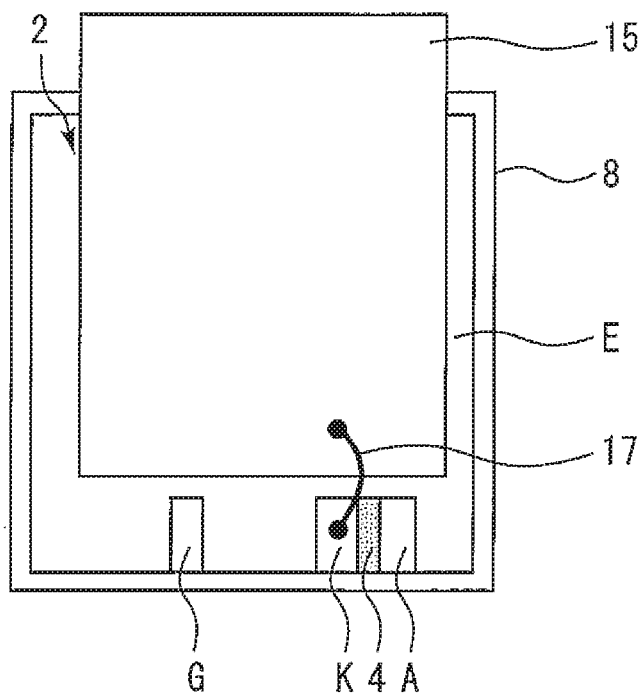
FIG. 7 is a top view of a semiconductor device according to Embodiment 5 of the present invention.
Figure 8:
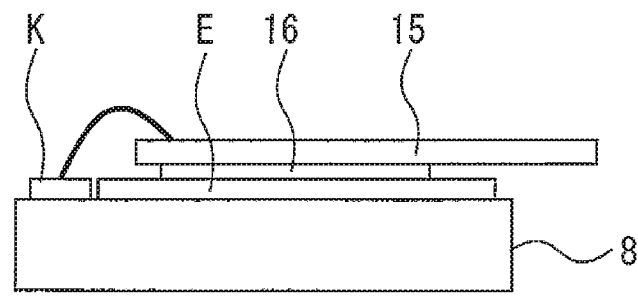
FIG. 8 is a sectional view of the semiconductor device according to Embodiment 5 of the present invention.

FIG. 7 is a top view of a semiconductor device according to Embodiment 5 of the present invention. FIG. 8 is a sectional view of the semiconductor device according to Embodiment 5 of the present invention. An electrode plate 15 is disposed on the semiconductor substrate 8. A back surface of the electrode plate 15 is joined to the emitter E of the transistor 2 by means of an electroconductive adhesive 16 such as solder. A wire 17 of, for example, Al or Cu connects an upper surface of the electrode plate 15 and the cathode K of the temperature detection diode 4. The emitter E of the transistor 2 and the cathode K of the temperature detection diode 4 are thereby connected to each other in the device. One external electrode 7 can therefore be shared therebetween. Also, there is no need to make a reappraisal of the structure of the electrode plate 15 with respect to the existing structure in which the electrode plate 15 is joined to the chip upper surface.

The semiconductor substrate 8 is not limited to a substrate formed of silicon. The semiconductor substrate 8 may be formed of a wide-bandgap semiconductor having a bandgap larger than that of silicon. The wide-bandgap semiconductor is, for example, silicon carbide, a gallium nitride-based material or diamond. A power semiconductor device formed of such a wide-bandgap semiconductor has a high withstand voltage and a high allowable current density and can therefore be reduced in size. Use of such a device reduced in size enables a semiconductor device incorporating the device to be also reduced in size. Also, because the heat resistance of the device is high, heat radiating fins of a heat sink can be reduced in size and a water cooling portion can be changed into an air cooling portion, so that the semiconductor module can be further reduced in size. Also, because the device has a reduced power loss and a high efficiency, the semiconductor module can be improved in efficiency.

DESCRIPTION OF SYMBOLS 2 transistor; 4 temperature detection diode; 7 external electrode; 8 semiconductor substrate; 9, 10, 13, 14, 17 wire; 12 relay pad; 15 electrode plate; E emitter; K cathode

The invention claimed is:

1. A semiconductor device comprising:
   a semiconductor substrate;
   a transistor on the semiconductor substrate;
   a temperature detection diode on the semiconductor substrate and monitoring temperature of an upper surface of the semiconductor substrate;
   an external electrode connected in common to an emitter or a source of the transistor and a cathode of the temperature detection diode; and
   a plurality of wires connected to the emitter or the source of the transistor,
   wherein one of the plurality of wires is stitched and connected to the cathode of the temperature detection diode.

2. A semiconductor device comprising:
   a semiconductor substrate;
   a transistor on the semiconductor substrate;
   a temperature detection diode on the semiconductor substrate and monitoring temperature of an upper surface of the semiconductor substrate;
   an external electrode connected in common to an emitter or a source of the transistor and a cathode of the temperature detection diode;
   a relay pad disposed outside the semiconductor substrate;
   a first wire connected the relay pad to the emitter or the source of the transistor; and
   a second wire connected the relay pad to the cathode of the temperature detection diode.

3. A semiconductor device comprising:
   a semiconductor substrate;
   a transistor on the semiconductor substrate;
   a temperature detection diode on the semiconductor substrate and monitoring temperature of an upper surface of the semiconductor substrate;
   an external electrode connected in common to an emitter or a source of the transistor and a cathode of the temperature detection diode;

an electrode plate on the semiconductor substrate and having a back surface joined to the emitter or the source of the transistor; and a wire connected an upper surface of the electrode plate to the cathode of the temperature detection diode.

\* \* \* \* \*